(12) United States Patent
Takeda

(10) Patent No.: US 11,527,704 B2
(45) Date of Patent: Dec. 13, 2022

(54) ACTUATOR AND TACTILE SENSATION PROVIDING APPARATUS

(71) Applicant: KYOCERA Corporation, Kyoto (JP)

(72) Inventor: Jun Takeda, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 931 days.

(21) Appl. No.: 16/083,523

(22) PCT Filed: Mar. 9, 2017

(86) PCT No.: PCT/JP2017/009607
§ 371 (c)(1),
(2) Date: Sep. 10, 2018

(87) PCT Pub. No.: WO2017/163917
PCT Pub. Date: Sep. 28, 2017

(65) Prior Publication Data
US 2019/0081231 A1  Mar. 14, 2019

(30) Foreign Application Priority Data

Mar. 24, 2016 (JP) .............................. JP2016-060589

(51) Int. Cl.

| | |
|---|---|
| *H01L 41/09* | (2006.01) |
| *H02N 2/04* | (2006.01) |
| *G06F 3/01* | (2006.01) |
| *B06B 1/06* | (2006.01) |
| *G06F 3/041* | (2006.01) |
| *H02N 2/00* | (2006.01) |
| *H02N 2/06* | (2006.01) |

(52) U.S. Cl.
CPC ........ *H01L 41/0906* (2013.01); *B06B 1/0666* (2013.01); *G06F 3/01* (2013.01); *G06F 3/016* (2013.01); *G06F 3/041* (2013.01); *H02N 2/0055* (2013.01); *H02N 2/04* (2013.01); *H02N 2/06* (2013.01)

(58) Field of Classification Search
CPC .... H01L 41/0906; H02N 2/0055; H02N 2/06; H02N 2/04; G06F 3/01; G06F 3/016; G06F 3/041; B06B 1/0666
See application file for complete search history.

(56) References Cited

U.S. PATENT DOCUMENTS

| | | | |
|---|---|---|---|
| 8,400,046 B2 | 3/2013 | Hayamizu | |
| 8,513,858 B2 | 8/2013 | Kagayama et al. | |
| 9,046,947 B2 | 6/2015 | Takeda et al. | |
| 9,559,688 B2 * | 1/2017 | Salter | H03K 17/955 |

(Continued)

FOREIGN PATENT DOCUMENTS

| | | | | |
|---|---|---|---|---|
| EP | 2 184 664 A1 | 5/2010 | | |
| FR | 3091414 A1 * | 7/2020 | ........... | B06B 1/0603 |

(Continued)

*Primary Examiner* — Emily P Pham
(74) *Attorney, Agent, or Firm* — Studebaker & Brackett PC

(57) ABSTRACT

An actuator includes a piezoelectric element, a vibration plate, and a support. The vibration plate has the piezoelectric element joined thereto and vibrates in accordance with displacement of the piezoelectric element. The support supports the vibration plate. A holder is disposed on the vibration plate. The holder is configured to join the vibration plate to an object of vibration. The vibration plate and the support are integrally molded.

8 Claims, 4 Drawing Sheets

(56) References Cited

U.S. PATENT DOCUMENTS

| | | | |
|---|---|---|---|
| 9,773,965 B2 | 9/2017 | Park et al. | |
| 2003/0067449 A1 | 4/2003 | Yoshikawa et al. | |
| 2004/0164971 A1* | 8/2004 | Hayward | G06F 3/016 345/179 |
| 2009/0096326 A1* | 4/2009 | Onishi | H04R 17/00 310/334 |
| 2010/0253485 A1* | 10/2010 | Park | G06F 1/1626 340/407.2 |
| 2010/0308691 A1 | 12/2010 | Hayamizu | |
| 2011/0095649 A1 | 4/2011 | Kagayama et al. | |
| 2013/0215080 A1* | 8/2013 | Takeda | G06F 3/016 345/174 |
| 2013/0286572 A1 | 10/2013 | Tsurusaki | |
| 2013/0328447 A1* | 12/2013 | Park | G06F 3/016 310/332 |
| 2014/0184545 A1 | 7/2014 | Tanaka | |
| 2014/0339958 A1 | 11/2014 | Park et al. | |
| 2016/0155926 A1* | 6/2016 | Ishii | H04R 7/20 381/190 |

FOREIGN PATENT DOCUMENTS

| | | |
|---|---|---|
| JP | 2003-169118 A | 6/2003 |
| JP | 2005-258666 A | 9/2005 |
| JP | 5452729 B2 | 3/2014 |
| JP | 2014-230482 A | 12/2014 |
| WO | 2007/026736 A1 | 3/2007 |
| WO | 2009/063610 A1 | 5/2009 |
| WO | 2009/141970 A1 | 11/2009 |

* cited by examiner

ACTUATOR AND TACTILE SENSATION PROVIDING APPARATUS

CROSS-REFERENCE TO RELATED APPLICATION

The present application claims priority to and the benefit of Japanese Patent Application No. 2016-60589 filed Mar. 24, 2016, the entire contents of which are incorporated herein by reference.

TECHNICAL FIELD

The present disclosure relates to an actuator and a tactile sensation providing apparatus.

BACKGROUND

An actuator that generates vibration has been provided in a touch sensor or the like. The actuator is, for example, a unimorph. The actuator vibrates an object of vibration, such as a touch sensor, thereby providing a tactile sensation to a user who touches the object of vibration. For example, vibration of the actuator is required to be transmitted efficiently to the object of vibration, and the actuator is required to be configured by a small number of components.

SUMMARY

An actuator according to an embodiment of the present disclosure includes a piezoelectric element, a vibration plate, and a support. The vibration plate has the piezoelectric element joined thereto and is configured to vibrate in accordance with displacement of the piezoelectric element. The support is configured to support the vibration plate. The vibration plate and the support are integrally molded.

A tactile sensation providing apparatus according to an embodiment of the present disclosure includes an actuator that includes a piezoelectric element, a vibration plate, and a support. The vibration plate has the piezoelectric element joined thereto and is configured to vibrate in accordance with displacement of the piezoelectric element. The support is configured to support the vibration plate. The tactile sensation providing apparatus includes an object of vibration configured to provide a tactile sensation to a user by vibration of the vibration plate being transmitted to the object of vibration. The vibration plate and the support are integrally molded.

DETAILED DESCRIPTION

Figure 1:
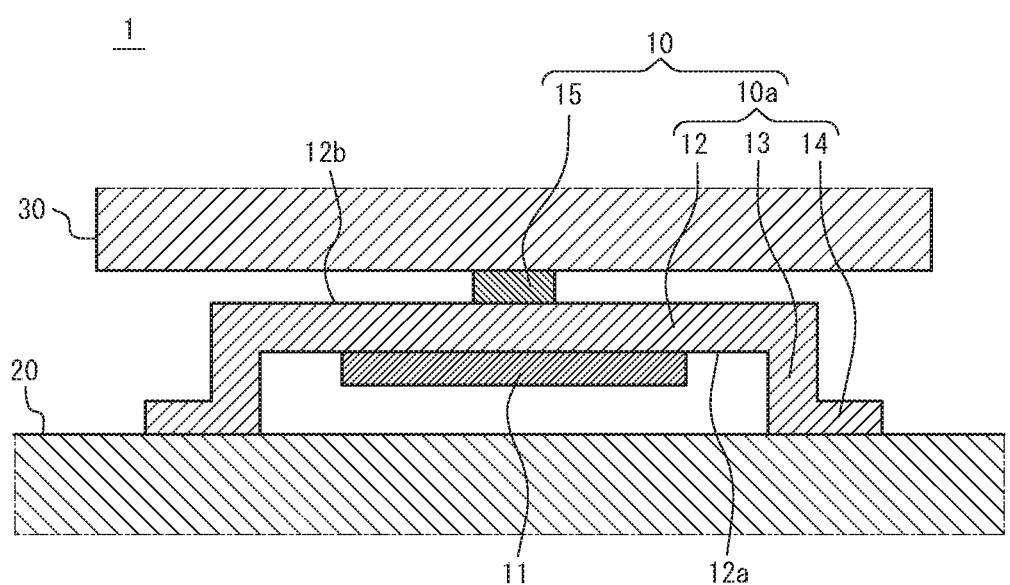
FIG. 1 is a main cross-section of an example configuration of a tactile sensation providing apparatus according to a first embodiment.

The tactile sensation provided to a user by a tactile sensation providing apparatus can be determined in accordance with the magnitude of vibration of an object of vibration. For the object of vibration to vibrate greatly, the vibration generated by the actuator needs to be transmitted efficiently to the object of vibration while the vibration is increased.

For example, when a unimorph actuator is disposed on the object of vibration, a support member is provided to support the actuator against a housing or the like. To reduce attenuation of vibration of the actuator and to increase the transmission efficiency of vibration to the object of vibration, a component made of rubber or the like is sometimes used as the support member. The number of components increases when using a component made of rubber or the like. An increase in the number of components may lead to a decrease in reliability and may also lead to a rise in manufacturing costs.

First Embodiment

An actuator according to the present embodiment may be used in a variety of devices. A tactile sensation providing apparatus according to the present embodiment may be an on-vehicle device such as a car navigation system, a steering wheel, or a power window switch. The tactile sensation providing apparatus may also be a mobile phone, a smartphone, a tablet personal computer (PC), a notebook PC, or the like. The tactile sensation providing apparatus is not limited to these examples and may be any of a variety of electronic devices, such as a desktop PC, a household appliance, an industrial device or factory automation (FA) device, a dedicated terminal, or the like. The drawings referred to below are schematic illustrations. The dimensional ratios and the like in the drawings do not necessarily match the actual dimensions.

[Example Configuration of Tactile Sensation Providing Apparatus]

As illustrated in FIG. 1, a tactile sensation providing apparatus 1 according to the present embodiment includes an actuator 10, a housing 20, and an object of vibration 30. The actuator 10 includes a piezoelectric element 11, a vibration plate 12, supports 13, fixing portions 14, and a holder 15. The actuator 10 is joined to the housing 20 by the fixing portions 14. The actuator 10 has the object of vibration 30 joined thereto via the holder 15.

Figure 2A:
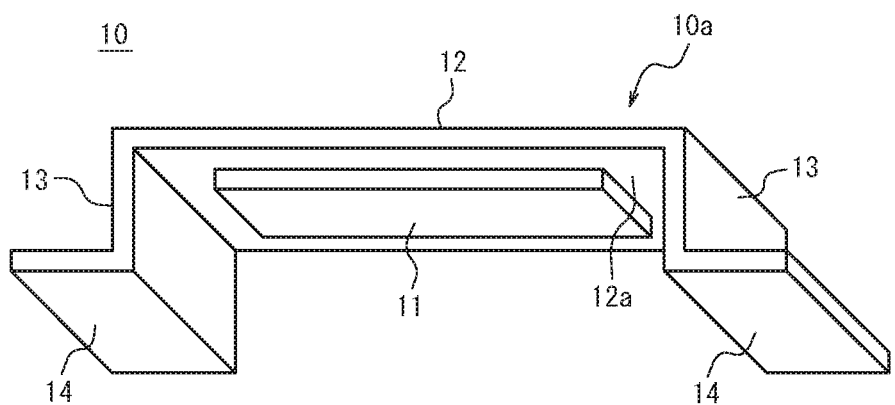
FIG. 2A is a perspective view of an example configuration of an actuator from the side joined to a housing.
Figure 2B:
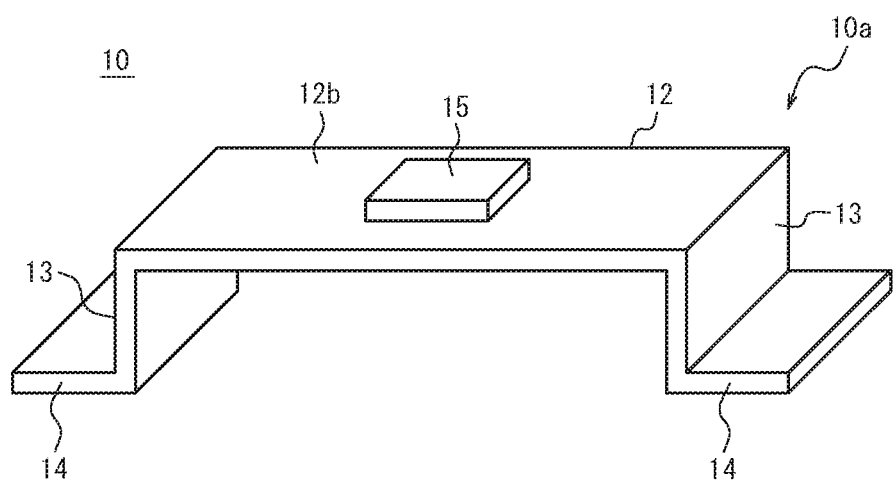
FIG. 2B is a perspective view of an example configuration of the actuator from the side joined to an object of vibration.

Each portion of the actuator 10 is described with reference to FIGS. 1, 2A, and 2B.

The piezoelectric element 11 is, for example, rectangular. The piezoelectric element 11 expands and contracts in the longitudinal direction in a variety of patterns in accordance with an applied voltage signal. The piezoelectric element 11 may have a different shape. The piezoelectric element 11 may be a piezoelectric film or piezoelectric ceramic. Piezoelectric ceramic can generate vibration having a greater vibration energy than piezoelectric film can.

The piezoelectric element 11 may be replaced with a magnetostrictor. A magnetostrictor expands and contracts in accordance with the applied magnetic field. A magnetostrictor is used together with a coil or the like that converts an applied voltage signal to a magnetic field.

The vibration plate 12 is a rectangular plate-shaped member having a predetermined thickness. The vibration plate 12 may have a different shape. The vibration plate 12 is, for example, a thin plate with elasticity. The vibration plate 12 may, for example, be made of metal, resin, or a composite material of metal, resin, and the like. The vibration plate 12 may be a thin metal plate. A thin metal plate is also referred to as a shim. The surface facing the housing 20 is also referred to as a first main surface 12a. The surface facing the object of vibration 30 is also referred to as a second main surface 12b.

The piezoelectric element 11 is provided on the first main surface 12a of the vibration plate 12. The piezoelectric element 11 is arranged so that the longitudinal direction of the piezoelectric element 11 matches the longitudinal direction of the vibration plate 12. The holder 15 is provided on the second main surface 12b of the vibration plate 12. The piezoelectric element 11 and the holder 15 are each joined to the vibration plate 12 by a method such as adhesion.

A structure in which the piezoelectric element 11 is provided on the first main surface 12a of the vibration plate 12 is known as a monomorph. In a monomorph, the expansion and contraction of the piezoelectric element 11 provokes bending vibration of the vibration plate 12. When only one end of the vibration plate 12 is supported by the housing 20, the vibration plate 12 vibrates with the amplitude in the normal direction of the first main surface 12a being maximized at the other end of the vibration plate 12. When both ends of the vibration plate 12 are supported by the housing 20, the vibration plate 12 vibrates with the amplitude in the normal direction of the first main surface 12a being maximized near the center of the vibration plate 12.

A support 13 is provided at each end of the vibration plate 12 in the longitudinal direction. The supports 13 maintain a clearance between the piezoelectric element 11 and the housing 20 to prevent the piezoelectric element 11 from hitting the housing 20 when the vibration plate 12 vibrates in accordance with displacement of the piezoelectric element 11. The supports 13 are, for example, thin plates with elasticity like the vibration plate 12. The supports 13 may be made of the same or different material as the vibration plate 12. When both ends of the vibration plate 12 are supported, the vibration plate 12 vibrates in accordance with displacement of the piezoelectric element 11, with the amplitude being maximized near the center of the vibration plate 12.

One end of each support 13 is connected to the vibration plate 12. The other end of each support 13 is connected to one of the fixing portions 14. The fixing portions 14 may, for example, be fixed to the housing 20 by screwing, adhesion, or the like. The fixing portions 14 may, for example, be thin plates with elasticity like the vibration plate 12. The fixing portions 14 may be made of the same or different material as the vibration plate 12.

In the actuator 10 according to the present embodiment, the vibration plate 12, the supports 13, and the fixing portions 14 are integrally molded. The member in which the vibration plate 12, the supports 13, and the fixing portions 14 are integrally molded is also referred to below as a frame 10a of the actuator 10. The frame 10a according to the present embodiment is entirely made of the same material. The frame 10a may, for example, be integrally molded by subjecting a thin sheet of metal to sheet-metal processing to bend the thin sheet. The frame 10a may be integrally molded by welding the vibration plate 12, the supports 13, and the fixing portions 14 together. The frame 10a may be made by integrally molding resin.

The holder 15 may, for example, be made of a rubber material. The holder 15 is not limited to a rubber material and may be made of another material, such as metal. The holder 15 is provided on the second main surface 12b side of the vibration plate 12. The holder 15 is joined to the vibration plate 12 using a method such as adhesion. The holder 15 is provided near the center on the second main surface 12b side. The position at which the holder 15 is provided is not limited being near the center. The holder 15 may be provided at the portion where the amplitude of the vibration plate 12 is maximized. The holder 15 has the object of vibration 30 joined thereto by a method such as adhesion, for example.

The holder 15 may have a large elastic modulus in the vibration direction of the vibration plate 12, i.e. in the normal direction of the first main surface 12a, to efficiently transmit vibration of the vibration plate 12 to the object of vibration 30. On the other hand, the holder 15 may have a small elastic modulus in a direction parallel to the first main surface 12a of the vibration plate 12. This configuration can reduce the likelihood of damage to the tactile sensation providing apparatus 1 due to an external force. The elastic modulus is a constant indicating the relationship between an external force acting on a member and the amount of displacement of the member. The external force on the member corresponds to the product of the amount of displacement and the elastic modulus. In other words, the same external force produces a larger amount of displacement as the elastic modulus is smaller.

The housing 20 has the actuator 10 joined thereto by the fixing portions 14. The housing 20 has a greater mass and a higher rigidity than the actuator 10 does. In the present embodiment, the housing 20 is considered to be a rigid body. The object of vibration 30 may, for example, be a touch sensor 50 provided in a device (see FIG. 3) or a switch. The object of vibration 30 has the actuator 10 joined thereto by the holder 15. When the housing 20 is considered to be a rigid body, the vibration generated by the actuator 10 is mainly transmitted to the object of vibration 30. By the vibration being transmitted from the actuator 10 to the object of vibration 30, the object of vibration 30 can provide a tactile sensation to the user that touches the object of vibration 30.

[Example Operations of Tactile Sensation Providing Apparatus]

Figure 3:
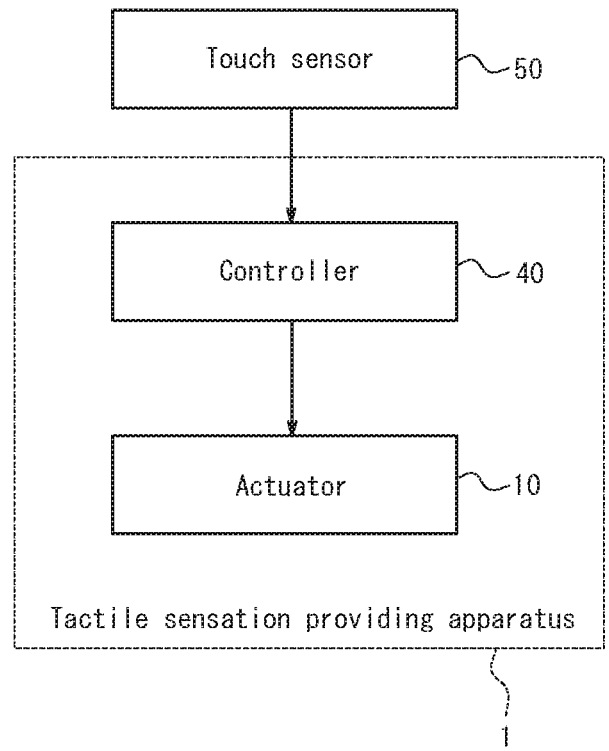
FIG. 3 illustrates an example of the functional blocks of the tactile sensation providing apparatus according to the first embodiment.

As illustrated in FIG. 3, the tactile sensation providing apparatus 1 further includes a controller 40. The controller 40 may be constituted by a processor, microcomputer, or the like capable of executing application software. The controller 40 may appropriately include a storage unit or the like constituted by memory or the like capable of storing various information as necessary.

As illustrated in FIG. 3, the controller 40 connects to the actuator 10. The controller 40 outputs a drive signal to the actuator 10. The drive signal may be a voltage signal that is applied to the piezoelectric element 11 of the actuator 10.

The piezoelectric element 11 expands and contracts in the longitudinal direction in accordance with the drive signal acquired from the controller 40. The vibration plate 12 of the example actuator 10 illustrated in FIGS. 1, 2A, and 2B bends in accordance with displacement of the piezoelectric element 11. When the piezoelectric element 11 is displaced by contracting in the longitudinal direction of the vibration plate 12, the vibration plate 12 bends so that the second main surface 12b side becomes convex. When the piezoelectric element 11 is displaced by expanding in the longitudinal direction of the vibration plate 12, the vibration plate 12 bends so that the first main surface 12a side becomes convex. Displacement of the piezoelectric element 11 is converted into vibration in the normal direction of the first main surface 12a of the vibration plate 12.

In the present embodiment, the piezoelectric element 11 is displaced only in the contracting direction in response to application of a voltage signal. In this case, the vibration plate 12 oscillates between a state in which the second main surface 12b side is bent to become convex and a normal, straight state. The piezoelectric element 11 is not limited to being displaced in the contracting direction in response to application of a voltage signal. The piezoelectric element 11 may be configured to be displaced in the expanding direction in response to application of a voltage signal or to be displaced in both the expanding direction and the contracting direction.

In this way, the controller 40 drives the actuator 10 and vibrates the vibration plate 12. Vibration of the vibration plate 12 is transmitted to the object of vibration 30 through the holder 15. A tactile sensation is provided to the user touching the object of vibration 30 by vibration being transmitted to the object of vibration 30.

As illustrated in FIG. 3, for example, the controller 40 may connect to the touch sensor 50. In this case, the controller 40 may output a drive signal to the actuator 10 in response to a signal acquired from the touch sensor 50. The touch sensor 50 may be the object of vibration 30 of the tactile sensation providing apparatus 1. In this case, a touch by the user on the object of vibration 30 is detected by the touch sensor 50. The controller 40 vibrates the object of vibration 30 when the user is touching the object of vibration 30. This configuration allows the tactile sensation providing apparatus 1 to provide a tactile sensation to the user touching the object of vibration 30. The touch sensor 50 may be provided as a separate structure from the object of vibration 30 of the tactile sensation providing apparatus 1.

[Shape of Frame]

Figure 4:
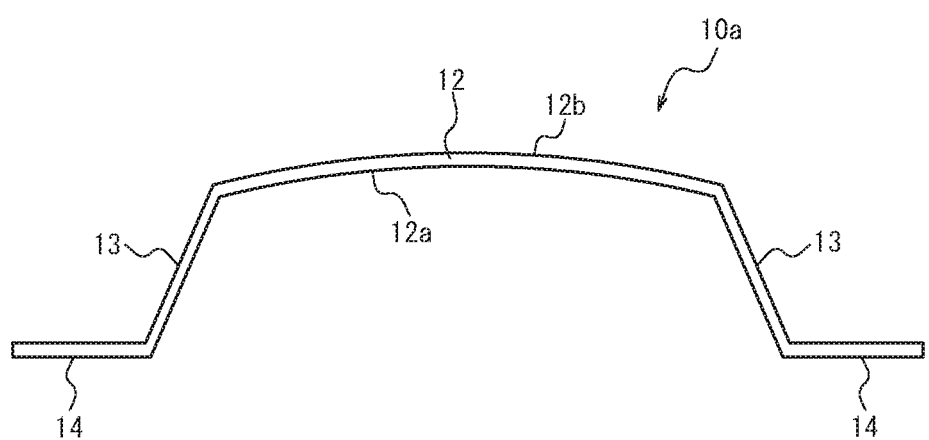
FIG. 4 illustrates an example cross-sectional shape of a frame when a piezoelectric element is displaced in a contracting direction.

The frame 10a of the actuator 10 elastically deforms in response to driving of the actuator 10. When a voltage signal is not being applied to the piezoelectric element 11, then the supports 13 are substantially upright relative to the fixing portions 14, as illustrated in the example in FIGS. 1, 2A, and 2B. In other words, when the piezoelectric element 11 is not expanding or contracting, the supports 13 are substantially upright relative to the fixing portions 14. On the other hand, when the piezoelectric element 11 is displaced in the contracting direction, the vibration plate 12 bends so that the second main surface 12b side becomes convex, as illustrated in FIG. 4. In accordance with the bending of the vibration plate 12, the upper portions of the supports 13 are pulled by the vibration plate 12. The lower portions of the supports 13 are fixed by the fixing portions 14. Consequently, the supports 13 incline. As compared to the example frame 10a illustrated in FIGS. 1, 2A, and 2B, the angles between the vibration plate 12 and the supports 13 and the angles between the supports 13 and the fixing portions 14 each increase.

Figure 5A:
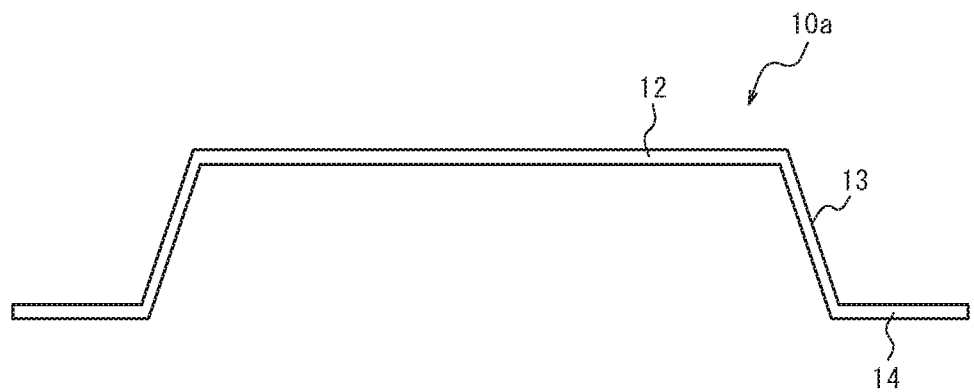
FIG. 5A illustrates an example frame in which supports have a different shape.
Figure 5B:
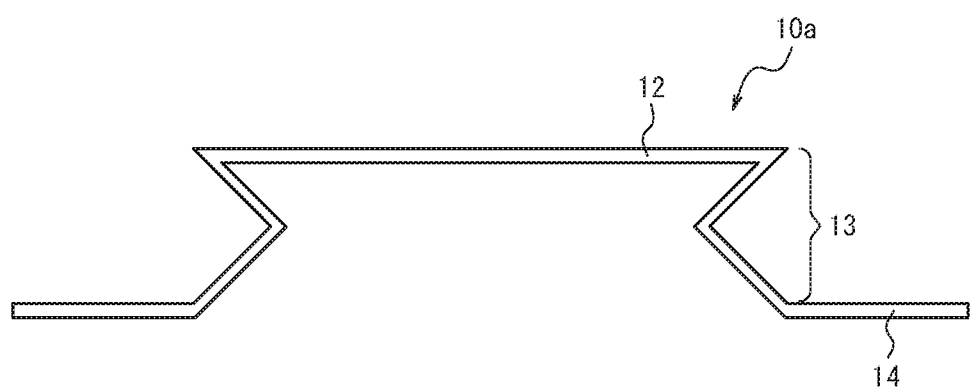
FIG. 5B illustrates an example frame in which supports have a different shape.

As illustrated in FIG. 4, the joint between the vibration plate 12 and the supports 13 and the joint between the supports 13 and the fixing portions 14 elastically deform so as not to obstruct vibration of the vibration plate 12. The supports 13 may bend and function like leaf springs. As illustrated in FIG. 5A, the angles between the vibration plate 12 and the supports 13 and the angles between the supports 13 and the fixing portions 14 may be obtuse. As illustrated in FIG. 5B, the supports 13 may have a zig-zag cross-sectional shape.

The supports 13 may be configured to transmit the vibration of the vibration plate 12 to the object of vibration 30 through the holder 15 while absorbing as little of the vibration as possible. The supports 13 may be configured to have a larger elastic modulus in the vibration direction of the vibration plate 12 and a smaller elastic modulus in the expanding and contracting direction of the piezoelectric element 11. The vibration direction of the vibration plate 12 corresponds to the normal direction of the first main surface 12a of the vibration plate 12. The expanding and contracting direction of the piezoelectric element 11 corresponds to the longitudinal direction of the first main surface 12a of the vibration plate 12. In other words, the supports 13 may be configured so that the ends of the vibration plate 12 are displaced more in the longitudinal direction than in the normal direction of the vibration plate 12 in accordance with expansion and contraction of the piezoelectric element 11. When the supports 13 are configured for smaller displacement of the ends of the vibration plate 12 in the normal direction of the vibration plate 12, the vibration of the vibration plate 12 is efficiently transmitted to the object of vibration 30. When the supports 13 are configured for greater displacement of the ends of the vibration plate 12 in the longitudinal direction of the vibration plate 12, attenuation of the vibration of the vibration plate 12 is reduced.

The vibration plate 12 and the supports 13 are integrally molded in the actuator 10 according to the first embodiment. As compared to when the vibration plate 12 and the supports 13 are configured as separate components, the first embodiment allows a reduction in the number of components and assembly steps while the supports 13 reduce attenuation of the vibration of the vibration plate 12 generated in accordance with expansion and contraction of the piezoelectric element 11. Furthermore, not using adhesive between the vibration plate 12 and the supports 13 lengthens the mean time between failure (MTBF) and improves the yield at the time of assembly.

Second Embodiment

Figure 6:
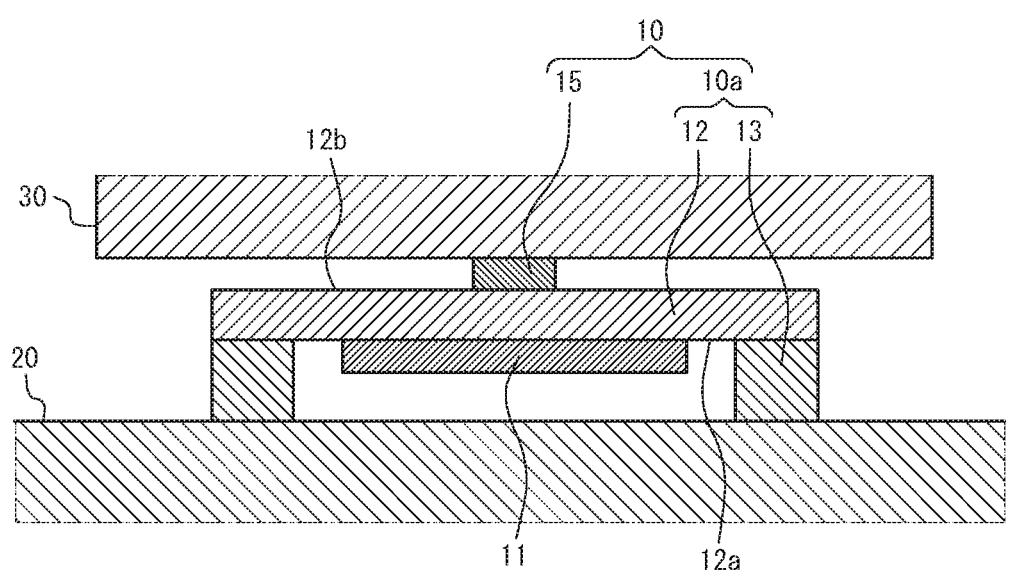
FIG. 6 is a main cross-section of an example configuration of a tactile sensation providing apparatus according to a second embodiment.

In the first embodiment, the entire frame 10a of the actuator 10 is made of the same material. In the second embodiment, the vibration plate 12 and the supports 13 are made of different materials. The configuration example of a tactile sensation providing apparatus 1 according to the second embodiment illustrated in FIG. 6 has similarities to and differences from FIG. 1. The differences from FIG. 1 are described below.

The vibration plate 12 of the present embodiment may, for example, be a thin plate with elasticity as in the first embodiment. The supports 13 are made of resin material. The resin material may, for example, be a rubber material such as silicone rubber or a sponge material such as hard sponge. As in the first embodiment, the supports 13 are configured to deform elastically so as to reduce attenuation of the vibration of the vibration plate 12. The supports 13 are directly joined to the housing 20 using a method such as adhesion.

In the present embodiment, the vibration plate 12 and the supports 13 are integrally molded. For example, the vibration plate 12 and the supports 13 may be integrally molded by molding resin that becomes the supports 13 around a metal vibration plate 12. The vibration plate 12 and the supports 13 may be integrally molded by engaging supports 13 made of resin with fitting portions provided in a metal vibration plate 12. The vibration plate 12 and the supports 13 may be integrally molded by applying primer to a joining face provided on a surface of a metal vibration plate 12 and molding resin onto the joining face. The vibration plate 12 and the supports 13 may be integrally molded by performing microfabrication on a joining face provided on a surface of a metal vibration plate 12 and molding resin onto the joining face.

The vibration plate 12 and the supports 13 made of different materials are integrally molded in the actuator 10 according to the second embodiment. As compared to when the vibration plate 12 and the supports 13 are configured as separate components, the second embodiment allows a reduction in the number of components and assembly steps while reducing attenuation of the vibration of the vibration plate 12 generated in accordance with displacement of the piezoelectric element 11. Not using adhesive between the vibration plate 12 and the supports 13 can lengthen the MTBF and improve the yield at the time of assembly.

Other Embodiments

In the first and second embodiments, the actuator 10 may be configured without the fixing portions 14. In this case, the ends of the supports 13 are joined to the housing 20 by adhesion or the like. The ends of the supports 13 may be configured to be pivotable about the portion joined to the housing 20.

The tactile sensation providing apparatus 1 and the actuator 10 of the present disclosure can reduce the number of components, improve reliability, and cut costs.

Although embodiments of the present disclosure have been described through drawings and examples, it is to be noted that various changes and modifications will be apparent to those skilled in the art on the basis of the present disclosure. Therefore, such changes and modifications are to be understood as included within the scope of the present disclosure.

The invention claimed is:

1. An actuator comprising:
a piezoelectric element;
a vibration plate that has the piezoelectric element joined thereto and is configured to vibrate in accordance with displacement of the piezoelectric element;
a support configured to support the vibration plate; and
a holder disposed on the vibration plate, the holder being configured to join the vibration plate to an object of vibration,
wherein the vibration plate and the support are integrally molded,
the actuator further comprises a fixing portion, and
the fixing portion is fixed to a housing by a region of the fixing portion facing a top surface of the housing, the region including a first part adjacent to a distal end of the fixing portion and a second part spaced apart from the distal end of the fixing portion.

2. The actuator of claim 1, wherein the vibration plate and the support are made of different materials.

3. The actuator of claim 2, wherein the support is configured so that an end of the vibration plate is displaced more in a longitudinal direction than in a normal direction of the vibration plate in accordance with displacement of the piezoelectric element.

4. The actuator of claim 1, wherein the support is configured so that an end of the vibration plate is displaced more in a longitudinal direction than in a normal direction of the vibration plate in accordance with displacement of the piezoelectric element.

5. A tactile sensation providing apparatus comprising:
an actuator comprising:
a piezoelectric element;
a vibration plate that has the piezoelectric element joined thereto and is configured to vibrate in accordance with displacement of the piezoelectric element;
a support configured to support the vibration plate; and
a holder disposed on the vibration plate; and
an object of vibration configured to provide a tactile sensation to a user by vibration of the vibration plate being transmitted to the object of vibration,
wherein the holder is configured to join the vibration plate to the object of vibration,
the vibration plate and the support are integrally molded,
the actuator further comprises a fixing portion, and
the fixing portion is fixed to a housing by a region of the fixing portion facing a top surface of the housing, the region including a first part adjacent to a distal end of the fixing portion and a second part spaced apart from the distal end of the fixing portion.

6. The tactile sensation providing apparatus of claim 5, wherein the vibration plate and the support are made of different materials.

7. The tactile sensation providing apparatus of claim 6, wherein the support is configured so that an end of the vibration plate is displaced more in a longitudinal direction than in a normal direction of the vibration plate in accordance with displacement of the piezoelectric element.

8. The tactile sensation providing apparatus of claim 5, wherein the support is configured so that an end of the vibration plate is displaced more in a longitudinal direction than in a normal direction of the vibration plate in accordance with displacement of the piezoelectric element.

* * * * *